(12) United States Patent
Noma et al.

(10) Patent No.: US 9,564,739 B2
(45) Date of Patent: Feb. 7, 2017

(54) SEMICONDUCTOR LASER DEVICE

(71) Applicant: ROHM CO., LTD., Kyoto (JP)

(72) Inventors: Tsuguki Noma, Kyoto (JP); Minoru Akutsu, Kyoto (JP); Yoshito Nishioka, Kyoto (JP)

(73) Assignee: ROHM CO., LTD, Kyoto (JP)

( * ) Notice: Subject to any disclaimer, the term of this patent is extended or adjusted under 35 U.S.C. 154(b) by 0 days.

(21) Appl. No.: 15/048,996

(22) Filed: Feb. 19, 2016

(65) Prior Publication Data

US 2016/0211651 A1 Jul. 21, 2016

Related U.S. Application Data

(63) Continuation of application No. 14/186,790, filed on Feb. 21, 2014, now Pat. No. 9,356,432, which is a continuation of application No. 13/323,785, filed on Dec. 12, 2011, now Pat. No. 8,699,536.

(30) Foreign Application Priority Data

Dec. 13, 2010 (JP) ................................ 2010-277091

(51) Int. Cl.
  *H01S 5/00* (2006.01)
  *H01S 5/343* (2006.01)
  (Continued)

(52) U.S. Cl.
  CPC .............. *H01S 5/3434* (2013.01); *B82Y 20/00* (2013.01); *H01S 5/2031* (2013.01);
  (Continued)

(58) Field of Classification Search
  CPC .... H01S 5/3202; H01S 5/3434; H01S 5/3436; H01S 5/2031; H01S 5/22; H01S 5/3404; H01S 5/3213
  (Continued)

(56) References Cited

U.S. PATENT DOCUMENTS 8,179,747 B1  5/2012 Mugino et al.
8,599,895 B2 * 12/2013 Nishioka ................ B82Y 20/00
                                                            372/45.01
(Continued)

FOREIGN PATENT DOCUMENTS

JP   2006-269581 A   10/2006

OTHER PUBLICATIONS

Casey et al.: "Refractive index of $Al_xGa_{1-x}As$ between 1.2 and 1.8 eV," Applied Physics Letters, Jan. 15, 1974, vol. 24, No. 2, pp. 63-65.
(Continued)

*Primary Examiner* — Kinam Park
(74) *Attorney, Agent, or Firm* — Rabin & Berdo, P.C.

(57) ABSTRACT

A semiconductor laser device capable of high output is provided. A semiconductor laser diode includes: a substrate; and a semiconductor stacked structure, which is formed on the substrate through crystal growth. The semiconductor stacked structure includes: an n-type $(Al_{x1}Ga_{(1-x1)})_{0.51}In_{0.49}P$ cladding layer and a p-type $(Al_{x1}Ga_{(1-x1)})_{0.51}In_{0.49}P$ cladding layer; an n-side $Al_{x2}Ga_{(1-x2)}As$ guiding layer and a p-side $Al_{x2}Ga_{(1-x2)}As$ guiding layer, which are sandwiched between the cladding layers; and an active layer, which is sandwiched between the guiding layers. The active layer is formed of a quantum well layer including an $Al_yGa_{(1-y)}As_{(1-x3)}P_{x3}$ layer and a barrier layer including an $Al_{x4}Ga_{(1-x4)}As$ layer that are alternatively repetitively stacked for a plurality of periods.

20 Claims, 7 Drawing Sheets

(51) Int. Cl.
  *B82Y 20/00*  (2011.01)
  *H01S 5/20*   (2006.01)
  *H01S 5/32*   (2006.01)
  *H01S 5/22*   (2006.01)
  *H01S 5/34*   (2006.01)

(52) U.S. Cl.
  CPC .......... *H01S 5/3202* (2013.01); *H01S 5/3436* (2013.01); *H01S 5/22* (2013.01); *H01S 5/3213* (2013.01); *H01S 5/3404* (2013.01); *H01S 2301/145* (2013.01); *H01S 2301/173* (2013.01)

(58) Field of Classification Search
  USPC .......................................... 372/45.011, 45.01
  See application file for complete search history.

(56) References Cited

U.S. PATENT DOCUMENTS

| | | | |
|---|---|---|---|
| 2006/0215717 A1* | 9/2006 | Shigihara | B82Y 20/00 372/43.01 |
| 2008/0175295 A1 | 7/2008 | Takayama et al. | |
| 2010/0103970 A1* | 4/2010 | Shigihara | B82Y 20/00 372/45.01 |

OTHER PUBLICATIONS

Tanaka et al: "Refractive indices of $In_{0.49}Ga_{0.51-x}Al_xP$ lattice matched to GaAs," Applied Physics Letters, vol. 59, No. 3, Feb. 1, 1986, pp. 985-986.

\* cited by examiner

SEMICONDUCTOR LASER DEVICE

This is a Continuation of U.S. application Ser. No. 14/186,790, filed on Feb. 21, 2014, and allowed on Nov. 20, 2016, which was a Continuation of U.S. application Ser. No. 13/323,785, filed on Dec. 12, 2011, and issued as U.S. Pat. No. 8,699,536 on Apr. 15, 2014, and claims the benefit of priority of Japanese Patent Application No. 2010-277091, filed on Dec. 13, 2010. The disclosures of these prior U.S. and foreign applications are incorporated herein by reference.

BACKGROUND OF THE INVENTION

1. Field of the Invention

The present invention relates to a semiconductor laser device.

2. Description of the Related Art

In order to increase storage capacity of a hard disc apparatus (HDD: Hard disc Drive), it is required to write a signal to a micro area of a magnetic disc. In order to both ensure the thermal stability of the signal and the recording of the signal in the micro area, a record medium with thermal stability is required, but the problem that overwriting needs a strong magnetic field will be generated. Currently, in an existing Giant Magneto Resistance (GMR) manner, record density tends to be saturated; therefore it is intended to achieve a "thermally assisted record" manner. The "thermally assisted record" manner is a manner in which a laser diode (semiconductor laser device) is used as a heat source to temporarily alleviate a force maintaining by a magnetic field and perform the task of writing.

DOCUMENT IN THE PRIOR ART

Patent Document

[Patent document 1] Japanese Patent Publication No. H2006-269581

Non-Patent Document

[Non-patent document 1] H. C. Casey Jr., D. D. Sell, and M. B. Panish, "Refractive index of $Al_xGa_{1-x}As$ between 1.2 and 1.8 eV", Applied Physics Letters, Vol. 24, No. 2, 63-65 (1974)

[Non-patent document 2] Hidenao Tanaka, Yuichi Kawamura, and Hajime Asahi, "Refractive indices of $In_{0.49}Ga_{0.51-x}Al_xP$ lattice matched to GaAs", Journal of Applied Physics 59 (3), 985-986 (1986)

SUMMARY OF THE INVENTION

Problem to be Solved by the Present Invention

In order to maintain compatibility with the existing sliding contactor manufacturing step in the "thermally assisted record" manner, a semiconductor laser device used in a record apparatus is different from a semiconductor laser device used by a conventional optical reading head, and a small chip size is required to obtain high output.

Moreover, a mounting space of a semiconductor laser device is limited, and due to different optical system designs, sometimes not only general Transverse Electric (TE) polarization of the conventional semiconductor laser device needs to be achieved, but also Transverse Magnetic (TM) polarization needs to be achieved.

The present invention provides a semiconductor laser device applicable to high output.

Technical Means for Solving the Problem

The semiconductor laser device of the present invention includes: a p-type cladding layer and an n-type cladding layer; a p-side guiding layer and an n-side guiding layer, which are sandwiched between the p-type cladding layer and the n-type cladding layer; and an active layer, which is sandwiched between the p-side guiding layer and the n-side guiding layer, and in which includes at least one quantum well layer. The p-type cladding layer and the n-type cladding layer both include an $(Al_{x1}Ga_{(1-x1)})_{0.51}In_{0.49}P$ layer ($0 \leq x1 \leq 1$). The p-side guiding layer and the n-side guiding layer both include an $Al_{x2}Ga_{(1-x2)}As$ layer ($0 \leq x2 \leq 1$), and the quantum well layer includes an $Al_yGa_{(1-y)}As_{(1-x3)}P_{x3}$ layer ($0 \leq x3 \leq 1$, $0 \leq y \leq 0.3$). Additionally, the contents of P and As in the $Al_yGa_{(1-y)}As_{(1-x3)}P_{x3}$ layer are x3 and (1-x3), respectively, and a ratio of x3/(1-x3) is no more than ¼.

The semiconductor laser device having the quantum well layer includes the arsenic group compound semiconductor as the $Al_yGa_{(1-y)}As_{(1-x3)}P_{x3}$ layer; if, for example, InGaAlP as the phosphorus group compound semiconductor forms a guiding layer, then a worry that the difference between the refractive index of the quantum well layer and the refractive index of the guiding layer is excessively large may exist. In this way, the optical closing effect is excessively large, so that the optical density on the end face part of the laser harmonic oscillator becomes larger. As a result, the optical damage of the end face (COD: Catastrophic Optical Damage) can be easily caused.

The optical damage of the end face refers to a phenomenon that when semiconductor laser is enabled to perform an action with high output so as to increase injection current, and the end face of the laser harmonic oscillator is damaged due to its own optical output. The optical damage of the end face is a main reason that is limiting high output.

The optical damage of the end face is generated in the following manner. Multiple interface states exist at an end face (cleavage plane) of semiconductor laser. When an electron and a hole perform non-luminous re-coupling through the interface state, energy released with the re-coupling becomes heat. In the semiconductor, as temperature increases, the energy gap becomes narrower, so the energy gap of the end face heated by the released energy becomes narrower. In the semiconductor laser, the sensing released light generated by re-coupling an electron and a hole is absorbed since the energy gap of the end face becomes narrower and becomes heat again, so that the energy gap of the end face becomes even narrower. Through repetition, the end face quickly reaches high temperature and melts to stop oscillation.

In the structure of the present invention, the quantum well layer includes the $Al_yGa_{(1-y)}As_{(1-x3)}P_{x3}$ layer as the arsenic group compound semiconductor, and the p-side guiding layer and the n-side guiding layer that both include the $Al_{x2}Ga_{(1-x2)}As$ layer ($0 \leq x2 \leq 1$) as the arsenic group compound semiconductor. Therefore, when compared with the situation that InGaAlP as a phosphorus group compound semiconductor forms a guiding layer, the refractive index difference between the guiding layer and the quantum well layer may be reduced. As a result, the optical closing effect may be prevented from becoming excessively large, so that the optical density on the end face part of the laser harmonic oscillator may be reduced. Therefore, the optical damage of the end face may be constrained, so that high output may be achieved.

Furthermore, because the adjustment extent of the bandgap of the $Al_{x2}Ga_{(1-x2)}As$ ($0 \leq x2 \leq 1$) layer forming the p-side guiding layer and the n-side guiding layer is large, the design of the emerging beam is easy to achieve. For example, a beam whose transverse section has an aspect ratio close to 1 can be outputted, which in other words, the beam whose transverse section is approximately circular.

Moreover, in the foregoing contents, the quantum well layer includes an $Al_yGa_{(1-y)}As_{(1-x3)}P_{x3}$ layer ($0 \leq x3 \leq 1$, $0 \leq y \leq 0.3$). Compared with other materials used as the quantum well layer, such as InGaP, the bandgap of $Al_yGa_{(1-y)}As_{(1-x3)}P_{x3}$ is smaller. Therefore, the bandgap difference between the cladding layer and the active layer can be increased. Therefore, a semiconductor laser device with good temperature characteristics, that is whose threshold current or action current changes less during temperature change, may be achieved.

Moreover, in the structure of the present invention, the contents of P and As in the $Al_yGa_{(1-y)}As_{(1-x3)}P_{x3}$ layer are x3 and (1−x3), respectively, and a ratio of x3/(1−x3) is no more than ¼. Because if the ratio x3/(1−x3) of the P content x3 to the As content (1−x3) is larger than ¼, the stretching distortion generated in the quantum well layer is increased due to the increase of the P content, so there exists a concern that a crack or leakage may be generated.

In the semiconductor laser device whose quantum well layer including the AlGaAsP layer, the cladding layer is generally formed by an AlGaAs layer. In the structure of the present invention, the quantum well layer is formed of an $Al_yGa_{(1-y)}As_{(1-x3)}P_{x3}$ layer, and the cladding layer is formed by an $(Al_{x1}Ga_{(1-x1)})_{0.51}In_{0.49}P$ layer. Therefore, the bandgap difference between the cladding layer and the active layer may be increased, thereby improving temperature characteristics. Moreover, as illustrated in detail above, because zinc can be easily diffused, the end face window structure can be easily manufactured.

In order to constrain the optical damage of the end face (COD), it is considered that impurities such as zinc are diffused at the end face part of the laser harmonic oscillator allowing the end face window structure of the bandgap of the active layer to expand. In order to manufacture the end face window structure, in a situation where impurities such as zinc are diffused, if an area where impurities should be diffused contains phosphorus, the diffusion speed may be accelerated.

As described above, in the structure of the present invention, the p-type the cladding layer and the n-type the cladding layer both include an $(Al_{x1}Ga_{(1-x1)})_{0.51}In_{0.49}P$ layer containing phosphorus. Therefore, impurities such as zinc can be easily diffused, thereby making the manufacturing of the end face window structure more easily. Therefore, the semiconductor laser device capable of high output may be achieved. Moreover, a ratio of the In content to the ($Al_{x1}Ga_{(1-x1)}$) content is 0.49/0.51, so the lattice of the p-type the cladding layer and the n-type the cladding layer matches that of the GaAs substrate, thereby obtaining high quality crystal. As a result, the semiconductor laser device with high reliability may be obtained.

Specifically, the semiconductor laser device preferably has a content of the $Al_{x2}Ga_{(1-x2)}As$ layer satisfying $x2 \geq 0.4$. The reason for this preference lies in that if x2 is smaller than 0.4, even if the end face window structure is manufactured at the end face part of the laser harmonic oscillator, the bandgap of the active layer on the end face part cannot be fully expanded.

This aspect is hereby further illustrated in detail. When the end face window structure is manufactured at the end face part of the laser harmonic oscillator, the bandgap of the active layer on the end face part becomes an average value of the bandgap of the guiding layer and the bandgap of the quantum well layer. Therefore, in order to fully expand the bandgap of the active layer on the end face part through manufacturing the end face window structure, the bandgap of the guiding layer must be no less than a particular value (specifically, 1.8 eV). In another aspect, the larger the Al content x2 is, the larger the bandgap of the $Al_{x2}Ga_{(1-x2)}As$ layer forming the guiding layer is. Also, by enabling the Al content x2 to be no less than 0.4, the bandgap of the guiding layer may be no less than a particular value.

In a situation when the mounting space of the semiconductor laser device is limited, TM mode oscillation may also be required at times. In this situation, it is preferred that the contents of P and As in the $Al_yGa_{(1-y)}As_{(1-x3)}P_{x3}$ layer are x3 and (1−x3), respectively, and a ratio of x3/(1−x3) is no less than ⅑ and no more than ¼. According to the structure, stretching distortion is generated at the active layer, and when compared with the TE mode, a ratio (strength ratio) in the TM mode may be increased. The smaller the lattice constant of the quantum well layer is, the larger the stretching distortion generated in the quantum well layer is. The larger the ratio of the P content to the As content is, the smaller the lattice constant of the $Al_yGa_{(1-y)}As_{(1-x3)}P_{x3}$ layer forming the quantum well layer is.

The reason why the ratio of the P content to the As content preferably is no less than ⅑ lies in the fact that if the ratio does not reach ⅑, the stretching distortion generated in the quantum well layer is not complete, so when compared with the TE mode, it is more difficult to increase the ratio in the TM mode. In another aspect, the reason why the ratio of the P content to the As content is preferably no more than ¼ lies in the fact that as described above, if the ratio is larger than ¼, the stretching distortion generated in the quantum well layer is increased due to the increase of the P content, so there exists a concern that a crack or leakage may be generated.

In a situation that the TE mode oscillation is required, the P content in the $Al_yGa_{(1-y)}As_{(1-x3)}P_{x3}$ layer is reduced. In this situation, the P content is preferably zero during the manufacturing process.

Moreover, in view of service life, it is preferably that the quantum well layer does not contain Al. That is, in view of service life, preferably y=0.

Moreover, specifically, the semiconductor laser device preferably has an oscillation wavelength of no less than 770 nm but no more than 830 nm, and the quantum well layer has a film thickness of no less than 9 nm but no more than 14 nm.

The reason for this preference lies in that in order to make the semiconductor laser device oscillate in the TM mode, the active layer is thickened to reduce the relative oscillation threshold current of the TE mode and the TM mode. When the Al content (y) in the quantum well layer is 0, the range of the oscillation wavelength is between 770 nm and 830 nm becomes the TM mode.

More specifically, the semiconductor laser device preferably has the end face window structure capable of expanding the bandgap of the active layer, which is formed on the end face part of the laser harmonic oscillator. When the end face window structure is formed on the end face part of the laser harmonic oscillator, the bandgap of the active layer may be expanded at the end face part. Therefore, it is difficult for the sensing released light generated by re-coupling of the internal electron and hole to be absorbed at the end face part of the laser harmonic oscillator, and therefore heat generation may be constrained. Therefore, the optical damage of the end face may be constrained, thereby achieving high output.

In view of mass production, the end face window structure is preferably formed by selectively diffusing, for example Zn, at the end face part of the laser harmonic oscillator. Additionally, the end face window structure may be formed by using a method in which other materials (for example, a material the same as the cladding layer) are embedded at the end face part of the laser harmonic oscillator or the active layer of the end face part is thinned.

The semiconductor laser device of the present invention includes: a p-type the cladding layer and an n-type the cladding layer, which include a phosphorus group compound semiconductor; a p-side the guiding layer and an n-side the guiding layer, which are sandwiched between the p-type the cladding layer and the n-type the cladding layer, include an arsenic group compound semiconductor; and an active layer sandwiched between the p-side guiding layer and the n-side guiding layer, which includes a quantum well layer containing an arsenic group compound semiconductor.

In an implementation manner of the present invention, the semiconductor laser device is one which includes a GaAs substrate and oscillates in a TM mode.

In an implementation manner of the present invention, the semiconductor laser device has a harmonic oscillator length that is no less than 200 µm and no more than 600 µm.

In an implementation manner of the present invention, the semiconductor laser device has a chip width that is no less than 50 µm and no more than 250 µm.

In an implementation manner of the present invention, the semiconductor laser device has a chip thickness that is no less than 30 µm and no more than 150 µm.

BRIEF DESCRIPTION OF THE DRAWINGS

The invention will be described according to the appended drawings in which.

PREFERRED EMBODIMENT OF THE PRESENT INVENTION

Below, implementation manners of the present invention are illustrated in detail with reference to accompanying drawings.

Figure 1:
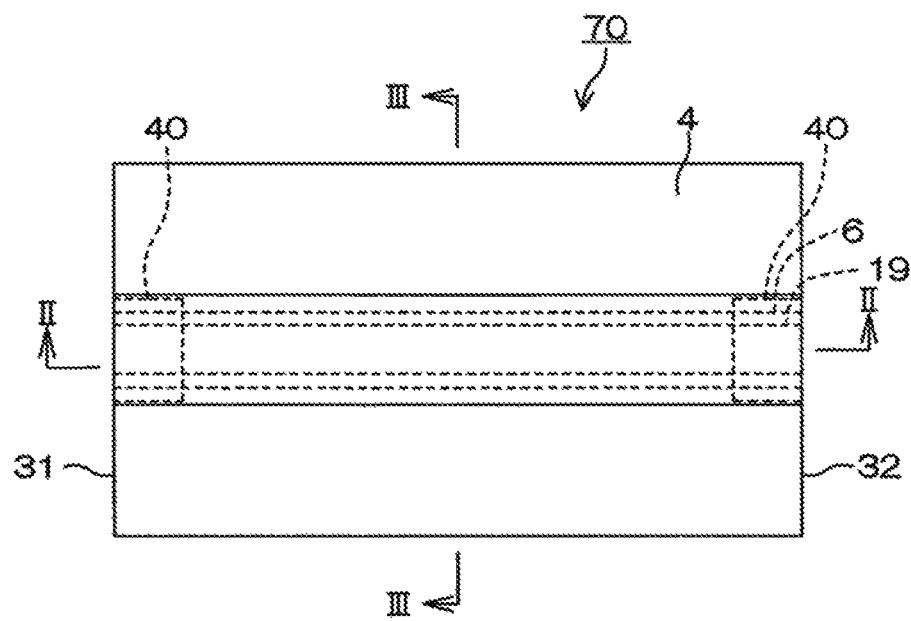
FIG. 1 is a top view used to illustrate a structure of a semiconductor laser diode according to an implementation manner of the present invention.
Figure 2:
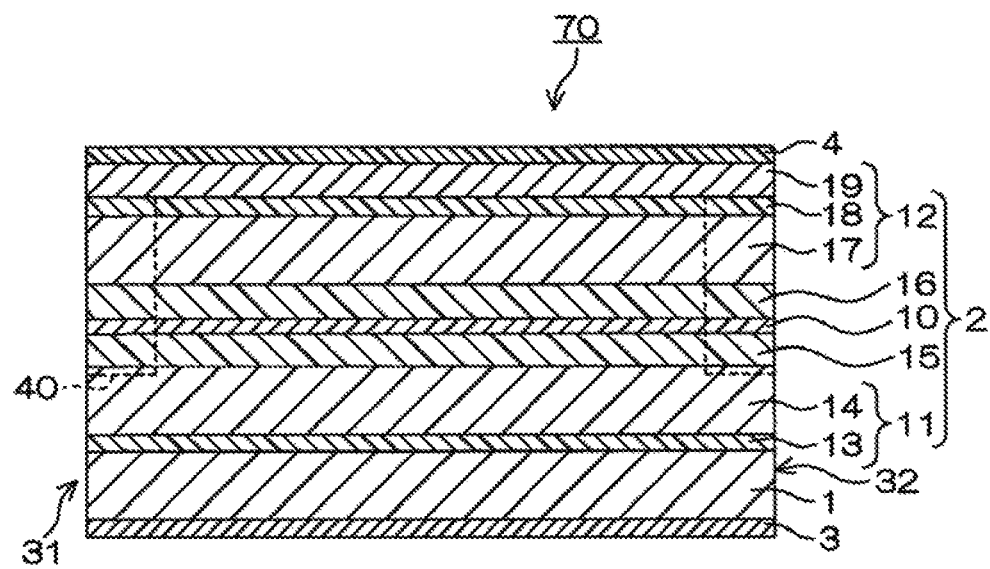
FIG. 2 is a sectional view along line II-II in FIG. 1.
Figure 3:
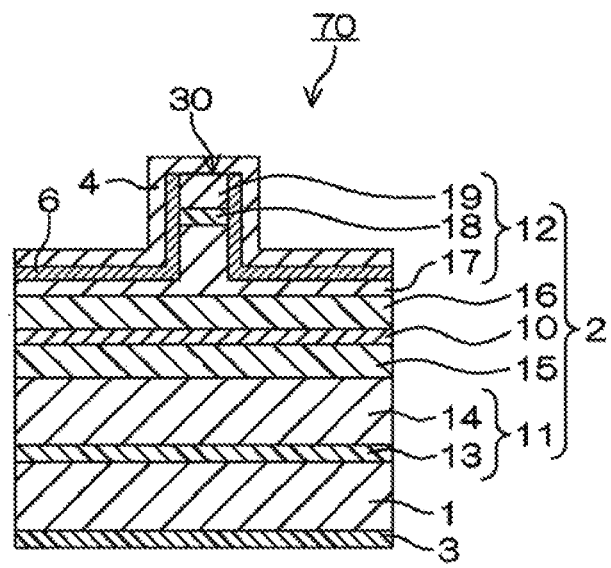
FIG. 3 is a sectional view along line in FIG. 1.

FIG. 1 is a top view used to illustrate a structure of a semiconductor laser diode according to an implementation manner of the present invention, FIG. 2 is a sectional view along line II-II in FIG. 1, and FIG. 3 is a sectional view along line III-III in FIG. 1.

The semiconductor laser diode 70 is of a Fabry-Perot type that includes: a substrate 1; a semiconductor stacked structure 2, which is formed on the substrate 1 through crystal growth; an n-type electrode 3, which is formed in a manner of contacting the back of the substrate (a surface opposite to the semiconductor stacked structure 2); and a p-type electrode 4, which is formed in a manner of contacting a surface of the semiconductor stacked structure 2.

The substrate 1 is formed of a GaAs monocrystalline substrate in the implementation manner. The face orientation of the surface of the GaAs substrate 1 has an inclination angle of 10° relative to the face 100. Layers forming on the semiconductor stacked structure 2 epitaxially grow on the substrate 1. The epitaxial growth refers to crystal growth in a state of maintaining the continuity of lattice from a base layer. The mismatching of the lattice of the base layer is absorbed through a distortion of the lattice of the layer under crystal growth, thereby maintaining the continuity of lattice on the interface of the base layer.

The semiconductor stacked structure 2 includes an active layer 10, an n-type semiconductor layer 11, a p-type semiconductor layer 12, an n-side guiding layer 15 and a p-side guiding layer 16. The n-type semiconductor layer 11 is configured at a side of the substrate 1 relative to the active layer 10, and the p-type semiconductor layer 12 is configured at a side of the p-type electrode 4 relative to the active layer 10. The n-side guiding layer 15 is configured between the n-type semiconductor layer 11 and the active layer 10, and the p-side guiding layer 16 is configured between the active layer 10 and the p-type semiconductor layer 12. In this way, a double-heterojunction is formed. Electrons are injected from the n-type semiconductor layer 11 to the active layer 10 through the n-side guiding layer 15, and holes are injected from the p-type semiconductor layer 12 to the active layer 10 through the p-side guiding layer 16. These electrons and holes are re-coupled in the active layer 10 to generate light.

The n-type semiconductor layer 11 is formed of an n-type GaAs buffer layer 13 (for example, thickness of 100 nm) and an n-type $(Al_{x1}Ga_{(1-x1)})_{0.51}In_{0.49}P$ cladding layer ($0 \leq x1 \leq 1$) 14 (for example, thickness of 3000 nm) sequentially stacked from a side of the substrate 1. In another aspect, the p-type semiconductor layer 12 is formed of a p-type $(Al_{x1}Ga_{(1-x1)})_{0.51}In_{0.49}P$ cladding layer ($0 \leq x1 \leq 1$) 17 (for example, thickness of 16 00 nm), a p-type InGaP band discontinuous buffer layer 18 (for example, thickness of 50 nm) and a p-type GaAs contact layer 19 (for example, thickness of 300 nm) are stacked on the p-type guiding layer 16.

The n-type GaAs buffer layer 13 is a layer disposed to increase cohesiveness between the GaAs substrate 1 and the n-type $(Al_{x1}Ga_{(1-x1)})_{0.51}In_{0.49}P$ cladding layer 14. The n-type GaAs buffer layer 13 forms an n-type semiconductor layer by doping; for example, Si as an n-type dopant in GaAs.

The p-type GaAs contact layer 19 is a low resistance layer used to be in an ohmic contact with the p-type electrode 4. The p-type GaAs contact layer 19 forms a p-type semiconductor layer by doping; for example, Zn as a p-type dopant in GaAs.

The n-type cladding layer 14 and the p-type cladding layer 17 are layers generating the optical closing effect to close the light from the active layer 10 between them. The n-type $(Al_{x1}Ga_{(1-x1)})_{0.51}In_{0.49}P$ cladding layer 14 forms an n-type semiconductor layer by doping for example, Si as an n-type dopant in $(Al_{x1}Ga_{(1-x1)})_{0.51}In_{0.49}P$. The p-type $(Al_{x1}Ga_{(1-x1)})_{0.51}In_{0.49}P$ cladding layer 17 forms a p-type semiconductor layer by doping for example, Zn as a p-type dopant in $(Al_{x1}Ga_{(1-x1)})_{0.51}In_{0.49}P$. Compared with the n-side guiding layer 15, the n-type $(Al_{x1}Ga_{(1-x1)})_{0.51}In_{0.49}P$ cladding layer 14 has a wider bandgap, and compared with the p-side guiding layer 16, the p-type $(Al_{x1}Ga_{(1-x1)})_{0.51}In_{0.49}P$ cladding layer 17 has a wider bandgap. Therefore, better optical closing and current carrier closing may be performed, thereby achieving an efficient semiconductor laser diode.

In order to achieve high output, the key is to constrain the optical damage of the end face. Therefore, preferably as described below, by diffusing impurities such as zinc at the end face part of the laser harmonic oscillator, the end face window structure 40 expanding the bandgap of the active layer 10 is created. In order to manufacture the end face window structure 40, in the situation of diffusing impurities such as zinc, if the area where impurities should be diffused does not include phosphorus, the diffusion speed is fast. In the implementation manner, the n-type cladding layer 14 and the p-type cladding layer 17 both include an $(Al_{x1}Ga_{(1-x1)})_{0.51}In_{0.49}P$ layer containing phosphorus. Therefore, impurities such as zinc can be easily diffused, so it is easy to manufacture the end face window structure 40. Therefore, the semiconductor laser diode capable of high output may be achieved.

Moreover, in the implementation manner, the n-type cladding layer 14 and the p-type cladding layer 17 make the ratio of the In content to the $(Al_{x1}Ga_{(1-x1)})$ content be 0.49/0.51, so they match the GaAs substrate 1 for lattice, thereby obtaining crystal of high quality. As a result, the semiconductor laser device with high reliability may be obtained.

The n-side guiding layer 15 includes an $Al_{x2}Ga_{(1-x2)}As$ ($0 \leq x2 \leq 1$) layer (for example, thickness of 50 nm), and is formed by stacking on the n-type semiconductor layer 11. The p-side guiding layer 16 includes an $Al_{x2}Ga_{(1-x2)}As$ ($0 \leq x2 \leq 1$) layer (for example, thickness of 50 nm), and is formed by being stacked on the active layer 10.

The n-side $Al_{x2}Ga_{(1-x2)}As$ guiding layer 15 and the p-side $Al_{x2}Ga_{(1-x2)}As$ guiding layer 16 are semiconductor layers generating the optical closing effect in the active layer 10, and form a current carrier closing structure together with the cladding layers 14 and 17 for the active layer 10. Therefore, the efficiency of the re-coupling of the electrons and the holes in the active layer 10 is increased.

The refractive index of $Al_{x2}Ga_{(1-x2)}As$ changes correspondingly to the Al content x2. For example, when energy of incident light (photon energy) is 1.38 eV, the refractive index in the situation of x2=0 (the refractive index of GaAs) becomes 3.590, and the refractive index in the situation of x2=1 (the refractive index of AlAs) becomes 2.971 (with reference to the non-patent document 1). Therefore, in $Al_xGa_{(1-x1)}As$, the adjustment extent of the refractive index is wide.

$Al_{x2}Ga_{(1-x2)}As$ ($0 \leq x2 \leq 1$) of the n-side guiding layer 15 and the p-side guiding layer 17 is formed; as described above, because the adjustment extent of the bandgap (refractive index) is large, the design of the emerging beam is easy to achieve. For example, a beam whose transverse section has an aspect ratio close to 1 can be outputted, which in other words, the beam whose transverse section is approximately circular.

The $Al_{x2}Ga_{(1-x2)}As$ layer of the guiding layers 15 and 16 is formed, preferably having a content satisfying $x2 \geq 0.4$. The reason for this preference lies in that when x2 is smaller than 0.4, even if the end face window structure is manufactured at the end face part of the laser harmonic oscillator, the bandgap of the active layer on the end face part cannot be fully expanded. Details about this are described below.

The active layer 10 has a multiple-quantum well (MQW) structure, for example AlGaAsP, which is a layer used to generate light through the re-coupling of electrons and holes and to enlarge the generated light.

Figure 4:
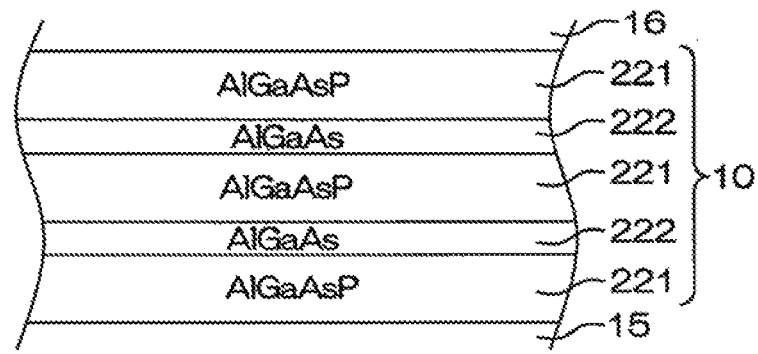
FIG. 4 is a diagrammatic sectional view used to illustrate a structure of an active layer of the semiconductor laser diode.

In the implementation manner, as shown in FIG. 4, the active layer 10 has the following MQW structure: the MQW structure is formed of a quantum well layer (for example, thickness of 13 nm) 221 including an undoped $Al_yGa_{(1-y)}As_{1-x3}P_{x3}$ layer ($0 \leq x3 \leq 1$, $0 \leq y \leq 0.3$) and a barrier layer (for example, thickness of 7 nm) 222 including an undoped $Al_{x4}Ga_{(1-x4)}As$ layer ($0 \leq x4 \leq 1$) layer which are alternatively repetitively stacked for a plurality of periods. In a distortion-free state, the AlGaAsP layer has a lattice constant smaller than that of the GaAs substrate 1, so a stretching stress (stretching distortion) is generated in the quantum well layer 221 including the $Al_yGa_{(1-y)}As_{x3}P_{(1-x3)}$ layer. Therefore, the semiconductor laser diode 70 may oscillate in the TM mode. Furthermore, the output light in the TM mode becomes TM wave whose magnetic field direction is perpendicular to the light transmission direction (the electric field direction is parallel to the light transmission direction).

The film thickness of the quantum well layer 221 is preferably no less than 9 nm and no more than 14 nm. The reason for this preference lies in that in order to oscillate in the TM mode, the active layer is thickened to reduce the relative oscillation threshold current of the TE mode and the TM mode.

When making the semiconductor laser diode 70 oscillate in the TE mode, the P content in the quantum well layer 221 is reduced. In this situation, the P content is preferably zero during the manufacturing process.

Compared with other materials used as the quantum well layer, for example InGaP, the bandgap of $Al_yGa_{(1-y)}As_{(1-x3)}P_{x3}$ forming the quantum well layer 221 is smaller. Therefore, the difference between the bandgap of the cladding layers 14 and 17 and the active layer 10 may be increased. Consequently, a semiconductor laser diode, which has good temperature characteristics, i.e. the threshold current or action current changes less while the temperature is changed, can be realized.

The $A_yGa_{(1-y)}As_{(1-x3)}P_{x3}$ layer of the quantum well layer 221 is formed, which preferably the contents of P and As in the $Al_yGa_{(1-y)}As_{(1-x3)}P_{x3}$ layer are x3 and (1–x3), respectively, and a ratio of x3/(1–x3) is no more than ¼. The reason for this preference lies in that if the ratio is larger than ¼, the stretching distortion generated in the quantum well layer 221 is increased due to the increase of the P content, so there exists the concern that a crack or leakage may be generated.

Further, the contents of P and As in the $Al_yGa_{(1-y)}As_{(1-x3)}P_{x3}$ layer are x3 and (1−x3), respectively, and a ratio of x3/(1−x3) is no less than ⅑. The reason for this preference lies in that compared with the TE mode, the ratio (strength ratio) in the TM mode is increased. In order to make the semiconductor laser device 70 oscillate in the TM mode, the stretching distortion must be generated in the quantum well layer 221. The smaller the lattice constant of the quantum well layer 221 is, the larger the stretching distortion generated at the quantum well layer 221 is. The larger the ratio of the P content to the As content is, the smaller the lattice constant of the $Al_yGa_{(1-y)}As_{(1-x3)}P_{x3}$ layer forming in the quantum well layer 221 is.

As shown in FIG. 3, a p-type cladding layer 17, a p-type band discontinuous buffer layer 18 and a p-type contact layer 19 in a p-type semiconductor layer 12 form a carinate stripe 30 by removing a part thereof. More specifically, a part of the p-type cladding layer 17, the p-type band discontinuous buffer layer 18 and the p-type contact layer 19 are etched away to form the carinate stripe 30, which is rather rectangular when observing its transverse cross section.

A side of the p-type contact layer 19, an exposed face of the p-type band discontinuous buffer layer 18 and an exposed face of the $(Al_{x1}Ga_{(1-x1)})_{0.51}In_{0.49}P$ cladding layer 17 are covered by a current barrier layer 6.

A semiconductor stacked structure 2 includes a pair of end faces (cleavage planes) 31 and 32 formed of cleavage planes at two ends in the length direction of the carinate stripe 30. The pair of end faces 31 and 32 are parallel to each other. In this way, a Fabry-Perot harmonic oscillator in which the pair of end faces 31 and 32 are set to the end faces of the harmonic oscillator is formed through an n-side guiding layer 15, an active layer 10 and a p-side guiding layer 16. That is, light is generated in the active layer 10 goes back and forth between the end faces 31 and 32 of the harmonic oscillator on one hand, and is enlarged through sensing release on the other hand. Then, a part of the enlarged light emerges as laser light from the end faces 31 and 32 of the harmonic oscillator to the outside of the device.

The length of the harmonic oscillator, for example, is no less than 200 μm and no more than 600 μm, and in the implementation manner is 300 μm. Moreover, the chip width of the semiconductor laser diode 70, for example, is no less than 50 μm and no more than 250 μm, and in the implementation manner is 120 μm. Moreover, the chip thickness, for example, is no less than 30 μm and no more than 150 μm, and in the implementation manner is 50 μm.

An n-type electrode 3 includes for example, AuGe/Ni/Ti/Au alloy, and is in an ohmic bond with the substrate 1 in a manner in which the AuGe side is configured at a side of the substrate 1. The p-type electrode 4 is formed in a manner that covers the exposed faces of the p-type contact layer 19 and the current barrier layer 6. The p-type electrode 4 includes for example, Ti/Au alloy, and is in an ohmic bond with the p-type contact layer 19 in a manner in which the Ti side is configured on the p-type contact layer 19. As shown in FIG. 1 and FIG. 2, the end face window structure 40 expanding the bandgap of the active layer 10 is formed at the end face part of the harmonic oscillator. The end face window structure 40 is formed by, for example, diffusing zinc (Zn) at the end face part of the harmonic oscillator.

According to the structure, the n-type electrode 3 and the p-type electrode 4 are connected to a power source, and inject electrons and holes to the active layer 10 from the n-type semiconductor layer 11 and the p-type semiconductor layer 12; therefore, the re-coupling of the electrons and the holes may be generated in the active layer 10, thereby generating, for example, light with the oscillation wavelength of no less than 770 nm and no more than 830 nm. The light goes back and forth between the end faces 31 and 32 of the harmonic oscillator along the guiding layers 15 and 16, and is enlarged through sensing release on the other hand. Then, more emerging laser is output outside from the end face 31 of the harmonic oscillator as a laser emerging end face.

Figure 5:
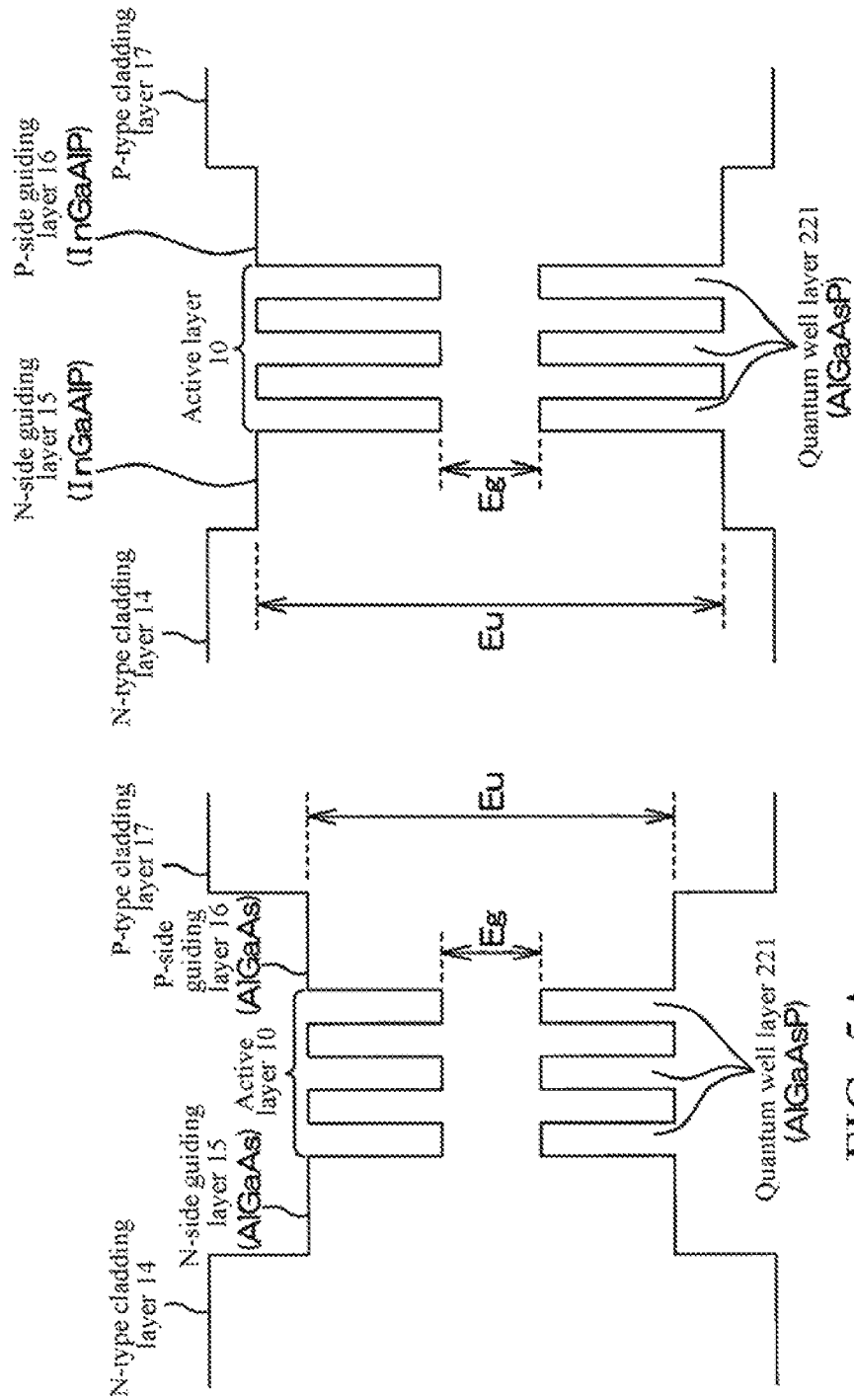
FIG. 5A is an energy band diagram denoting the bandgap of this implementation manner.
FIG. 5B is an energy band diagram denoting the bandgap in a situation when the guiding layer includes InGaAlP.

FIG. 5A is an energy band diagram used to illustrate the bandgaps of the cladding layers 14 and 17, the guiding layers 15 and 16, and the active layer 10. FIG. 5B is an energy band diagram used to illustrate the bandgaps of the layers in a situation that InGaAlP as a phosphorus group compound semiconductor forms a guiding layer.

In the semiconductor laser diode 70 of the implementation manner, the quantum well layer 221 in the active layer 10 includes an $Al_yGa_{(1-y)}As_{(1-x3)}P_{x3}$ layer (0≤x3≤1, 0≤y≤0.3) as an arsenic group compound semiconductor. In the semiconductor laser diode 70 of the implementation manner, the cladding layers 14 and 17 are formed of a phosphorus group compound semiconductor $(Al_{x1}Ga_{(1-x1)})_{0.51}In_{0.49}P$ (0.5≤x1≤1), and in another aspect, the guiding layers 15 and 16 are formed of an arsenic group compound semiconductor $Al_{x2}Ga_{(1-x2)}As$ (0≤x2≤1)) instead of a phosphorus group compound semiconductor.

As shown by comparing FIG. 5A and FIG. 5B, when the situation that $Al_{x2}Ga_{(1-x2)}As$ as an arsenic group compound semiconductor forms the guiding layers 15 and 16 (FIG. 5A) is compared with the situation that InGaAlP as a phosphorus group compound semiconductor forms the guiding layer (FIG. 5B), the bandgap Eu of the guiding layers 15 and 16 can be reduced. Therefore, in the semiconductor laser diode 70 of this implementation manner, the difference (Eu−Eg) between the bandgap Eu of the guiding layers 15 and 16 and the bandgap Eg of the quantum well layer 221 may be reduced.

Generally, in a situation regarding semiconductor, the smaller the bandgap difference is, the smaller the refractive index difference is, so the optical closing effect may be prevented from becoming excessively large, thereby buffering the optical density on the end face part of the laser harmonic oscillator. Therefore, the optical damage of the end face may be constrained, thereby achieving high output. Moreover, compared with the guiding layer including InGaAlP, the $Al_{x2}Ga_{(1-x2)}As$ guiding layers 15 and 16 have higher heat conductivity, and therefore may also have the advantage of efficiently diffusing heat. Therefore, it is helpful that the semiconductor laser diode 70 may be controlled stably, and the optical damage of the end face can be constrained.

Figure 6:
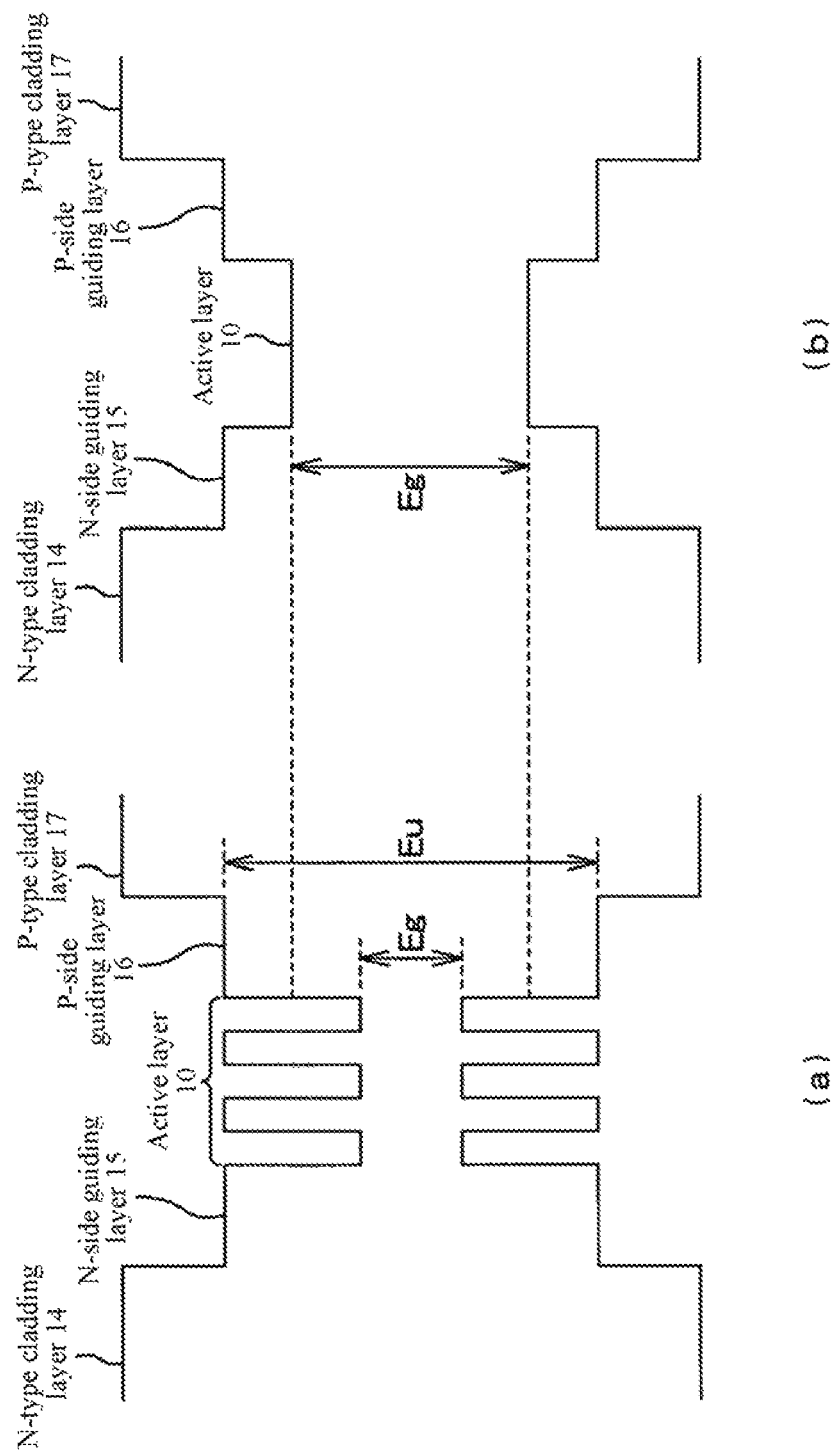
FIG. 6 is an energy band diagram used to illustrate bandgaps of a cladding layer, a guiding layer and an active layer, FIG. 6 (a) is an energy band diagram denoting bandgaps of layers at a central portion between end face portions of a harmonic oscillator, and FIG. 6 (b) is an energy band diagram denoting bandgaps of layers in an end face window structure formed at an end face portion of a harmonic oscillator.

FIG. 6 (a) is an energy band diagram denoting bandgaps of layers at a central portion between end face portions of a harmonic oscillator. FIG. 6 (b) is an energy band diagram denoting bandgaps of layers in an end face window structure formed at an end face portion of a harmonic oscillator.

In the foregoing implementation manner, the end face part of the harmonic oscillator is formed with the end face window structure 40 expanding the bandgap of the active layer 10. Therefore, as shown in FIG. 6 (b), in the end face part of the harmonic oscillator, the bandgap Eg of the active layer 10 becomes an average value of the bandgap Eg (with reference to FIG. 6 (a)) of the active layer 10 in the middle of the harmonic oscillator and the bandgap Eu (with reference to FIG. 6 (a)) of the guiding layers 15 and 16 (barrier layer 222). That is, in the end face part of the harmonic oscillator, compared with these middle parts, the bandgap Eg of the active layer 10 becomes larger. Therefore, it is difficult for the sensing released light generated through the recoupling of internal electrons and holes to be absorbed at the end face part of the harmonic oscillator, thereby constraining heat generation. Therefore, generation of the optical damage of the end face may be constrained, thereby achieving high output.

The reason why the $Al_{x2}Ga_{(1-x2)}As$ layer forming the guiding layers 15 and 16 is preferably to have contents satisfying x2≥0.4 is detailed below. When the end face window structure 40 is created at the end face part of the laser harmonic oscillator, the bandgap of the active layer 10 on the end face part becomes the average value of the bandgap of the guiding layers 15 and 16 and the bandgap of the quantum well layer 221. Therefore, in order to fully expand the bandgap of the active layer 10 at the end face part by creating the end face window structure 40, the bandgap of the guiding layers 15 and 16 must become a value that is no less than a particular value (specifically, about 1.8 eV). In another aspect, as far as the bandgap of the $Al_{x2}Ga_{(1-x2)}As$ layer forming the guiding layers 15 and 16 is concerned, the more the Al content contained therein, that is, the larger x2 is, the larger the bandgap thereof is. Also, the bandgap of the guiding layers 15 and 16 may be no less than the particular value by enabling x2 to be no less than 0.4.

FIG. 7 to FIG. 10 are transverse cross section diagrams denoting a manufacturing method for the semiconductor laser diode 70 shown in FIG. 1 to FIG. 3.

Figure 7:
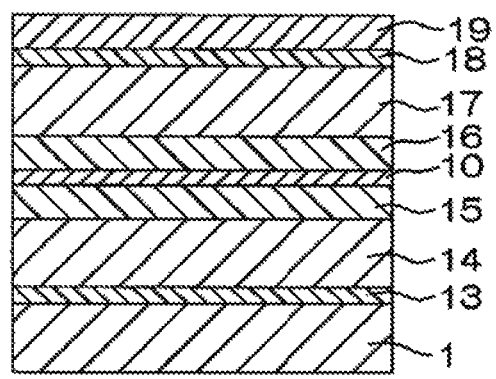
FIG. 7 is a sectional view denoting a manufacturing step of the semiconductor laser diode.

Firstly, as shown in FIG. 7, an n-type GaAs buffer layer 13, an n-type $(Al_{x1}Ga_{(1-x1)})_{0.51}In_{0.49}P$ cladding layer 14, an n-side $Al_{x2}Ga_{(1-x2)}As$ guiding layer 15, an active layer 10, a p-side $Al_{x2}Ga_{(1-x2)}As$ guiding layer 16, a p-type $(Al_{x1}Ga_{(1-x1)})_{0.51}In_{0.49}P$ cladding layer 17, a p-type InGaP band discontinuous buffer layer 18 and a p-type GaAs contact layer 19 sequentially grows on a GaAs substrate 1 through Metal Organic Chemical Vapor Deposition (MOCVD). Furthermore, the active layer 10 is formed through growth of a quantum well layer 221 including an $Al_yGa_{(1-y)}As_{(1-x3)}P_{x3}$ layer and a barrier layer 222, which includes an $Al_{x4}Ga_{(1-x4)}As$ layer, alternatively repetitively stacked for a plurality of periods.

Secondly, referring to FIG. 1, at an area close to the end face of the semiconductor laser diode 70, ZnO (zinc oxide) is patterned. Then, annealing processing is performed for about 8 hours at 500 to 650° C., for example, and therefore Zn is diffused at the area close to the end face of the semiconductor laser diode 70. In this case, annealing processing is performed in a manner to make Zn be diffused across the active layer 10 and the n-side guiding layer 15 and reach the n-type cladding layer 14. Therefore, the end face window structure 40 is formed at the area close to the end face of the semiconductor laser diode 70.

Figure 8:
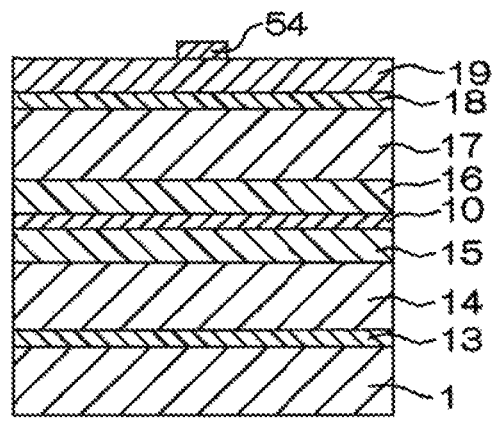
FIG. 8 is a sectional view denoting a manufacturing step of the semiconductor laser diode.
Figure 9:
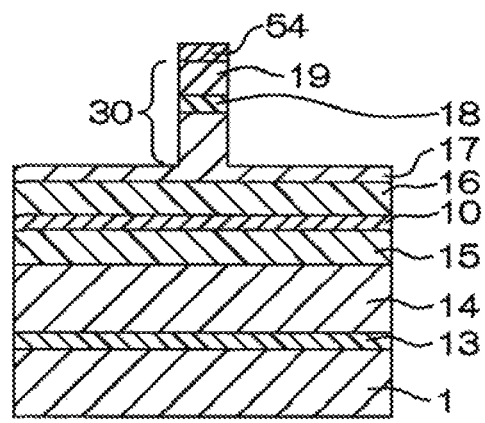
FIG. 9 is a sectional view denoting a manufacturing step of the semiconductor laser diode.

Subsequently, the ZnO layer is removed. Then, as shown in FIG. 8, a stripe-shaped insulating film as a mask 54 is etched, and therefore a part of the p-type GaAs contact layer 19, the InGaP band discontinuous buffer layer 18 and the p-type $(Al_{x1}Ga_{(1-x1)})_{0.51}In_{0.49}P$ cladding layer 17 are removed. In this way, as shown in FIG. 9, the carinate stripe 30 stacked with the mask layer 54 on the top face is formed.

Figure 10:
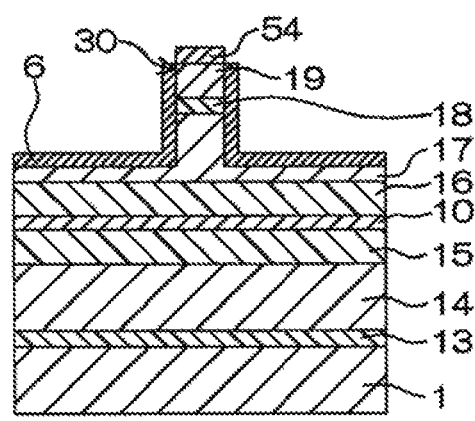
FIG. 10 is a sectional view denoting a manufacturing step of the semiconductor laser diode.

Then, as shown in FIG. 10, the current barrier layer 6 is enabled to form a film on a surface. In this case, the mask layer 54 functions as a mask. Therefore, the top face of the carinate stripe 30 is not covered by the current barrier layer 6.

Afterward, the mask layer 54 is removed. Subsequently, in a manner of covering the exposed faces of the current barrier layer 6 and the p-type GaAs contact layer 19, the p-type electrode 4 in an ohmic contact with the p-type GaAs contact layer 19 is formed. Moreover, the n-type electrode 3 in an ohmic contact with the GaAs substrate 1 is formed.

Above, an implementation manner of the present invention is illustrated, but the present invention may be further implemented in other manners. For example, a semiconductor laser diode in which P is not added in the quantum well layer and in which oscillate in the TE mode may also be configured.

While several embodiments of the present invention have been illustrated and described, various modifications and improvements can be made by those skilled in the art. The embodiments of the present invention are therefore described in an illustrative but not in a restrictive sense. It is intended that the present invention should not be limited to the particular forms as illustrated and that all modifications which maintain the spirit and scope of the present invention are within the scope defined in the appended claims.

What is claimed is:

1. A semiconductor laser device, comprising:
   a p-type cladding layer and an n-type cladding layer;
   a p-side guiding layer and an n-side guiding layer between the p-type cladding layer and the n-type cladding layer, including an arsenic group compound semiconductor, and having bandgaps narrower than those of the p-type cladding layer and the n-type cladding layer; and
   an active layer between the p-side guiding layer and the n-side guiding layer, including at least one quantum well layer;
   the p-type cladding layer and the n-type cladding layer include an AlGaInP layer or a GaInP layer respectively;
   the quantum well layer includes an AlGaAsP layer.

2. The semiconductor laser device according to claim 1, wherein the p-type cladding layer and the n-type cladding layer respectively include an $(Al_{x1}Ga_{(1-x1)})_{0.51}In_{0.49}P$ layer (0≤x1≤1);
   the quantum well layer includes an $Al_yGa_{(1-y)}As_{(1-x3)}P_{x3}$ layer (0≤x3≤1, 0≤y3≤3).

3. The semiconductor laser device according to claim 1, further comprising a harmonic oscillator having a length of 200 μm to 600 μm.

4. The semiconductor laser device according to claim 2, further comprising a harmonic oscillator having a length of 200 μm to 600 μm.

5. The semiconductor laser device according to claim 1, wherein an oscillation wavelength of the semiconductor laser device is 770 nm to 830 nm, and the quantum well layer has a film thickness of 9 nm to 14 nm.

6. The semiconductor laser device according to claim 2, wherein an oscillation wavelength of the semiconductor laser device is 770 nm to 830 nm, and the quantum well layer has a film thickness of 9 nm to 14 nm.

7. The semiconductor laser device according to claim 3, wherein an oscillation wavelength of the semiconductor laser device is 770 nm to 830 nm, and the quantum well layer has a film thickness of 9 nm to 14 nm.

8. The semiconductor laser device according to claim 1, wherein an end face window structure expanding a bandgap of the active layer is formed on an end face part of a laser harmonic oscillator.

9. The semiconductor laser device according to claim 2, wherein an end face window structure expanding a bandgap of the active layer is formed on an end face part of a laser harmonic oscillator.

10. The semiconductor laser device according to claim 3, wherein an end face window structure expanding a bandgap of the active layer is formed on an end face part of a laser harmonic oscillator.

11. The semiconductor laser device according to claim 5, wherein an end face window structure expanding a bandgap of the active layer is formed on an end face part of a laser harmonic oscillator.

12. The semiconductor laser device according to claim 1, further comprising a GaAs substrate, and the semiconductor laser device oscillates in a Transverse Magnetic (TM) mode.

13. The semiconductor laser device according to claim 2, further comprising a GaAs substrate, and the semiconductor laser device oscillates in a Transverse Magnetic (TM) mode.

14. The semiconductor laser device according to claim 3, further comprising a GaAs substrate, and the semiconductor laser device oscillates in a Transverse Magnetic (TM) mode.

15. The semiconductor laser device according to claim 5, further comprising a GaAs substrate, and the semiconductor laser device oscillates in a Transverse Magnetic (TM) mode.

16. The semiconductor laser device according to claim 8, further comprising a GaAs substrate, and the semiconductor laser device oscillates in a Transverse Magnetic (TM) mode.

17. The semiconductor laser device according to claim 1, further comprising a chip, wherein the chip has a width of 50 μm to 250 μm; and
a thickness of 30 μm to 150 μm.

18. The semiconductor laser device according to claim 2, further comprising a chip, wherein the chip has a width of 50 μm to 250 μm; and
a thickness of 30 μm to 150 μm.

19. The semiconductor laser device according to claim 3, further comprising a chip, wherein the chip has a width of 50 μm to 250 μm; and
a thickness of 30 μm to 150 μm.

20. The semiconductor laser device according to claim 5, further comprising a chip, wherein the chip has a width of 50 μm to 250 μm; and
a thickness of 30 μm to 150 μm.

* * * * *